(12) United States Patent
Lee et al.

(10) Patent No.: US 7,550,390 B2
(45) Date of Patent: Jun. 23, 2009

(54) METHOD AND APPARATUS FOR DIELECTRIC ETCHING DURING INTEGRATED CIRCUIT FABRICATION

(75) Inventors: Hong-Ji Lee, Hsinchu (TW); Chun-Hung Lee, Hsinchu (TW); Nan-Tsu Lian, Hsinchu (TW)

(73) Assignee: Macronix International Co., Ltd, Hsinchu (TW)

( * ) Notice: Subject to any disclaimer, the term of this patent is extended or adjusted under 35 U.S.C. 154(b) by 416 days.

(21) Appl. No.: 11/326,031

(22) Filed: Jan. 4, 2006

(65) Prior Publication Data

US 2007/0167002 A1    Jul. 19, 2007

(51) Int. Cl.
*H01L 21/461* (2006.01)
(52) U.S. Cl. .................. 438/710; 438/714; 438/737; 257/E21.218

(58) Field of Classification Search .................. 438/710, 438/714, 737
See application file for complete search history.

(56) References Cited

U.S. PATENT DOCUMENTS

| | | | |
|---|---|---|---|
| 6,399,511 B2 * | 6/2002 | Tang et al. | 438/714 |
| 2002/0096116 A1 * | 7/2002 | Tamura et al. | 118/728 |
| 2003/0024643 A1 * | 2/2003 | Abatchev et al. | 156/345.1 |
| 2005/0287814 A1 * | 12/2005 | Lee et al. | 438/710 |

* cited by examiner

*Primary Examiner*—Alexander G Ghyka
(74) *Attorney, Agent, or Firm*—Baker & McKenzie LLP (57) ABSTRACT

A method for multi-step dielectric etching includes discharge steps between each of the etching steps in order to help release accumulated charge on the wafer produced by the previous etching step. The discharge steps stabilize the plasma discharge in each transition between etching steps. Charge elimination occurs because the negative species is relatively higher at the beginning of plasma spiking and can reach the wafer surface to reduce the accumulated charge.

20 Claims, 7 Drawing Sheets

METHOD AND APPARATUS FOR DIELECTRIC ETCHING DURING INTEGRATED CIRCUIT FABRICATION

BACKGROUND

1. Field of the Invention

The present invention relates to the manufacture of integrated circuits on a substrate, and more particularly to a method for releasing the accumulation of charge on the wafer between etching steps comprising the etching process.

2. Background of the Invention

It is always difficult to maintain the stability of plasma discharge in a multi-step etching process. This is especially true for dielectric damascene etching applications. Charge will often accumulate on the wafer during a plasma oxide etching process. This accumulation of charge can prove detrimental in multi-etching step processes.

For example, when etching hole architectures, e.g., contact holes, via holes, etc., multiple etching steps are often required. In order to maintain stability throughout the process, the beginning and ending of each etching step must be tightly controlled. It has been noted that a smoother transition between etching steps in a multi-etching step process can be achieved by limiting the change in the total active gas flow used during the multiple etching steps. For example, it has been shown that by maintaining the principal etching gas substantially the same, with only the selective addition of polymer formers and oxygen containing gases, smoother transitions can be achieved. Again, it has been shown that the changes in total active gas flow should be kept below 30% in order to achieve such stability.

Logic circuitry fabricated on the substrate requires several layers of metallization with intervening inter-level dielectric layers. Small contact, or via holes need to be etched through each of the dielectric layers. The contact, or via holes are then filled with a conductor, composed typically of aluminum or copper. A horizontal wiring layer is often formed over one dielectric layer and then covered by another dielectric layer. The horizontal wiring and the underlying vias are often referred to as a single wiring layer. In a conventional process, not only are the contact, or via holes often filled with, e.g., aluminum or copper, but in addition, the contact, or via holes are also overfilled in order to form a thick planar layer over both the filled holes and the dielectric. Conventionally, a metal lithographic step then photographically defines a photo resist layer over the planar metal layers and etches be exposed metal into a network of conductive interconnects.

Via holes usually represent the smallest dimension defined in a dielectric etch. The smallest defined lateral dimension in a particular level is often referred to as the critical dimension (CD). Power levels typically require a larger via size, for example, 0.6 µm, while signal levels typically require smaller via sizes for example, 0.3 µm. These diameters grow smaller and smaller as processing capability is advanced. But as critical dimensions are reduced with advanced processing techniques, the need for stable etching is increased. Unfortunately, due to the accumulated charge that is created between etching steps and a multiple etching step process, it is difficult to achieve the process stability required to achieve acceptable failure rates.

For example, while the etching processes associated with holes typically are not halted as a result of charge accumulated on the wafer during an etching step, processing of trench-type architectures often suffer high halt rates as a result of the large accumulation of charge, which creates an effect similar to a capacitive effect.

SUMMARY

A method for multi-step dielectric etching includes discharge steps between each of the etching steps in order to help release accumulated charge on the wafer produced by the previous etching step. The discharge steps stabilize the plasma discharge in each transition between etching steps. Charge elimination occurs because the negative species is relatively higher at the beginning of plasma spiking and can reach the wafer surface to reduce the accumulated charge.

In one aspect, after a discharge step plasma is stabilized under a limited reflected power by holding a matching network constant at its most recent condition, thus providing a smoother transition between the etching steps without extinguishing the plasma.

These and other features, aspects, and embodiments of the invention are described below in the section entitled "Detailed Description."

BRIEF DESCRIPTION OF THE DRAWINGS

For a more complete understanding of the invention, and the advantages thereof, reference is now made to the following descriptions taken in conjunction with the accompanying drawings, in which.

DETAILED DESCRIPTION

Figure 1:
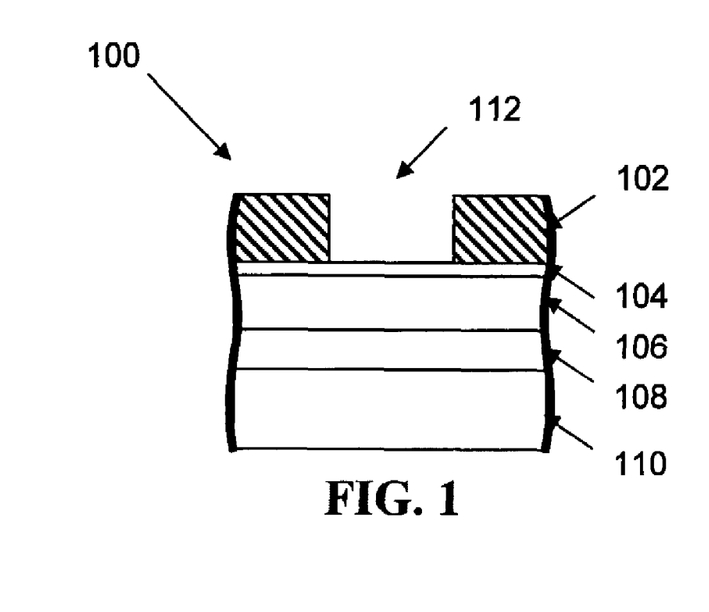
FIG. 1-4 is a diagram illustrating various steps in the formation of a trench structure in a single damascene structure in accordance with one embodiment.

FIG. 1 is a diagram illustrating an exemplary single damascene structure 100. Single damascene structure 100 comprises 4 layers as illustrated. These layers include a lower dielectric layer 110, a UV block layer 108, an upper oxide layer 106 and a DARC layer 104. Depending on the embodiment, no photolithography is performed between layers 108, 106, and 104 and the composition of these layers may be such as to allow their growth by chemical vapor deposition (CVD) in a single plasma reacting chamber by varying the composition of the feed gases and the operating conditions between the layers.

As illustrated in FIG. 1, once single damascene structure 100 comprising layers 104, 106, and 108, grown on substrate 110 is formed, a photo resist layer 102 can be deposited on top of layer 104. Layer 102 can then be photographically patterned to form a mask aperture 112, e.g., corresponding to a trench structure that is to be formed in single damascene structure 100.

Figure 2:
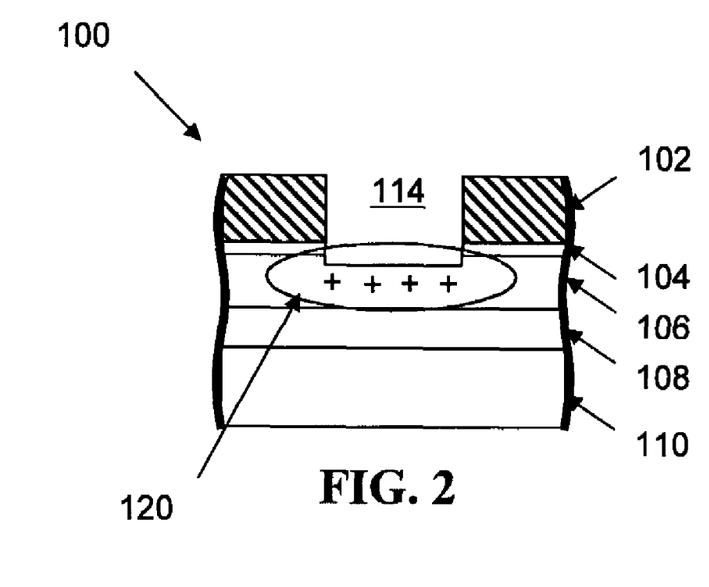
Figure 4:
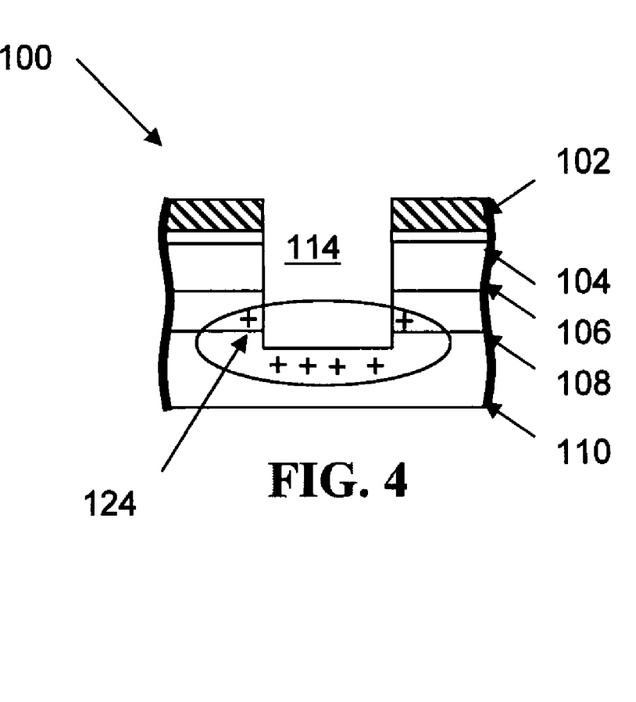
Figure 5:
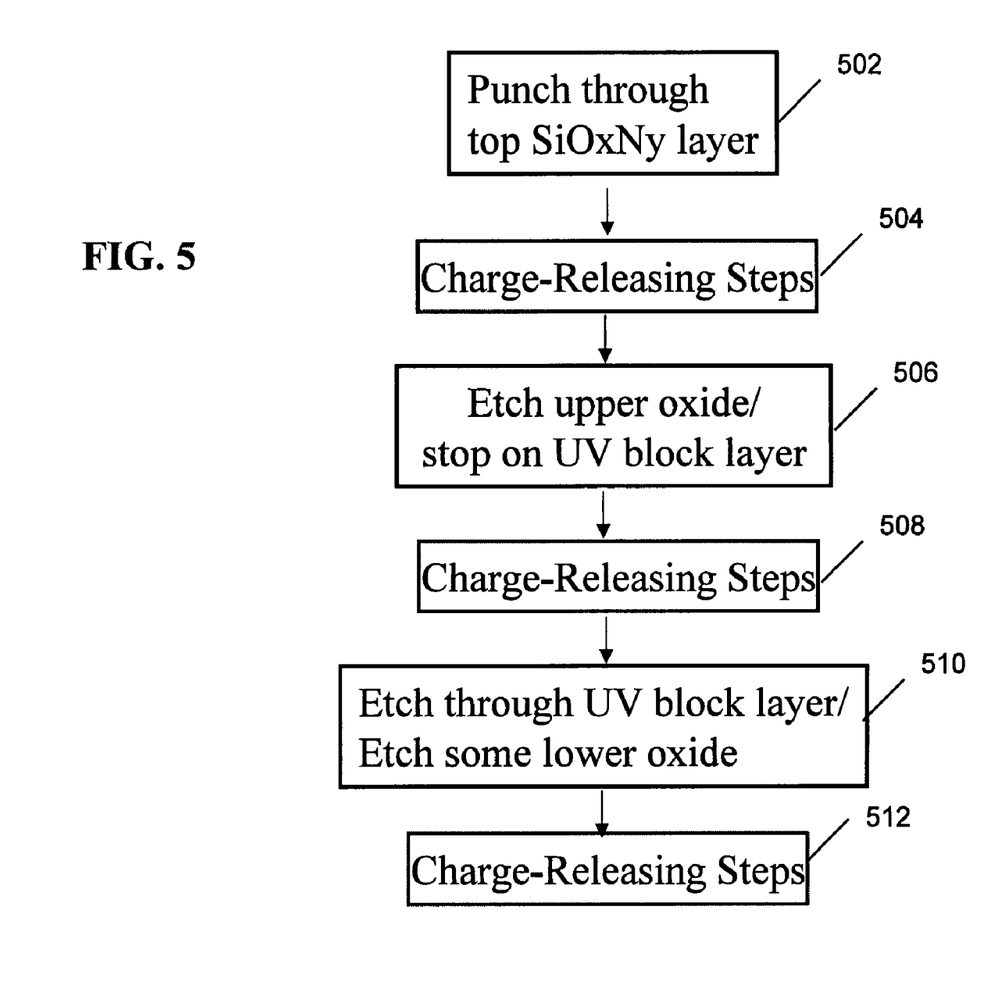
FIG. 5 is a flow chart illustrating a process for forming the trench in the structure of FIG. 1-4 in accordance with one embodiment.

FIG. 5 is a flowchart illustrating an example process for etching the trench defined by aperture 112 in accordance with one embodiment of the systems and methods described herein. The steps of FIG. 5, can be illustrated in conjunction with FIGS. 2, 3, 4. The beginning of trench 114 is formed by punching through top layer 104 as illustrated in FIG. 2. Depending on the embodiment, upper layer 104 can comprise a $SiO_xN_y$ layer.

As illustrated in FIG. 2, after first etching step 502, charge 120 will accumulate in single damascene structure 100. As noted above, accumulated charge 120 can be great enough to cause the etching process to halt prematurely. Thus, in step 504, a charge releasing step is performed in order to release some or all of accumulated charge 120. Enough of charge 120 should be released so as to prevent the premature halt of the etching process.

Figure 3:
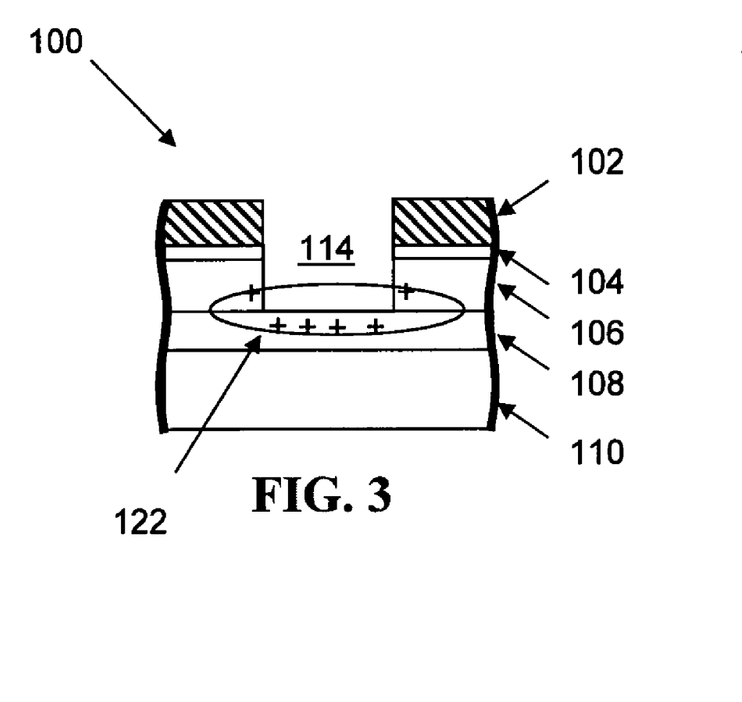

In step 506, upper oxide layer 106 is etched in order to extend trench 114. Upper oxide layer 106 is etched down to UV block layer 108, which acts as a stop layer for the etching process of step 506. Again, charge 122 will accumulate within single damascene structure 100 as illustrated in FIG. 3. Thus, a second charge releasing step is performed in step 508 in order to release some or all of accumulated charge 122. Again, enough of accumulated charge 122 should be released during step 508 to prevent the premature halt of the etching process of step 506.

UV block layer 108 is then etched through in step 510 in order to extend trench 114 down to lower oxide layer 110. In certain embodiments, some portion of lower oxide layer 110 is etched during step 510 of the process illustrated in FIG. 5.

In other embodiments, different plasma etch reactors can be used for different steps of process 500; however, it can be preferable to use a single plasma etch reactor for each of the steps in FIG. 5. Further, other types of HDP etch reactors can be used such as a remote plasma source (RPS) reactor or an electron cyclotron resonance (ECR) reactor.

Alternatively, in certain embodiments, an inductively-coupled high density plasma (HDP) etch reactor can be used. Such a reactor can provide both the selectivity and process flexibility require to satisfy the conflicting requirements associated with formation of a trench, such as trench 114, and holes, such as via or contact holes. A high density plasma can be defined as a plasma filling the entire states that it's in, excluding plasma sheaths, and having an ionization density of at least $10^{11}$ cm$^{-3}$.

A process recipe for performing the process of FIG. 5 on the single damascene structure of table 1, is illustrated in table 2. Using the recipe of table 2, a failure rate of less than 1% can be achieved during the trench etching process of FIG. 5. Contrastingly, if charge releasing steps 504, 508, and 512, are not included in the etching process, failure rates during etching can be as high as 80%.

TABLE 2

|  | 1st Substep | CR[a] Steps x2 | 2nd Substep | CR Steps x2 | 3rd Substep | CR Steps x2 |
| --- | --- | --- | --- | --- | --- | --- |
| Pressure(mt) | 60 | Position | 60 | Position | 60 | Position |
| Source power; 27 MHz (W) | 600 | 70 | 1000 | 70 | 600 | 70 |
| Bias Power; 2 MHz (W) | 900 | 0 | 1800 | 0 | 400 | 0 |
| Ar flow (sccm) | 135 | 800 | 250 | 800 | 250 | 800 |
| CF4 flow (sccm) | 45 | 0 | 0 | 0 | 60 | 0 |
| C4F8 flow (sccm) | 5 | 0 | 7 | 0 | 0 | 0 |
| CH2F2 flow (sccm) | 0 | 0 | 16 | 0 | 0 | 0 |
| CO flow (sccm) | 0 | 0 | 50 | 0 | 0 | 0 |
| O2 flow (sccm) | 13 | 0 | 8 | 0 | 10 | 0 |
| Backside He pressure (T) | 15 | 7 | 15 | 7 | 15 | 7 |
| Etching Time (s) | 20 | 5 | 20 | 5 | 40 | 5 |

[a]CR = charge releasing

Again, charge 124 will accumulate after etching step 510. Accumulated charge 124 can be released in charge releasing step 512 in order to prevent the premature halt of the etching process of step 510.

Table 1 illustrates parameters associated with an exemplary un-patterned single damascene structure on which the process of FIG. 5 can be performed. All depositions for the structure described in table 1 can be performed in the same plasma reaction chamber adapted for the supply of the different gases required and that includes hardware compatible with the different types of deposited material. The steps of FIG. 5 can then be carried out by a plasma etch reactor, such as a capacitively coupled plasma reactor, such as a dual frequency capacitively coupled plasma reactor.

TABLE 1

|  | Composition | Thickness |
| --- | --- | --- |
| DARC | SiON | 57 nm |
| Upper Oxide | Oxide | 250 nm |
| UV block | Si-enriched Oxide | 150 nm |
| Lower Dielectric | Oxide | 150 nm |

In the example of table 2, the reactor is a dual frequency, i.e., 27 MHz and 2 Mhz, capacitively coupled plasma chamber. The first etching step, step 502, uses an Ar flow of 135 sccm and a gas mixture comprising $CF_4/C_4F_8/O_2$ for 20 seconds. The source power for the etching step of step 502 is 600 W, while the bias power is 900 W. The first charge releasing step (504) then uses an Ar flow of 800 sccm for 5 seconds, with a source power of 70 W and no bias power.

The second etching step, step 506, uses an Ar flow of 250 sccm and a gas mixture comprising $C_4F_8/CH_2F_2/CO/O_2$ for 20 seconds. The source power for the etching step of step 506 is 1000 W, while the bias power is 1800 W. The second charge releasing step (508) then uses an Ar flow of 800 sccm for 5 seconds, with a source power of 70 W and no bias power.

The third etching step, step 510, uses an Ar flow of 250 sccm and a gas mixture comprising $CF_4/O_2$ for 40 seconds. The source power for the etching step of step 510 is 600 W, while the bias power is 400 W. The third charge releasing step (512) then uses an air flow of 800 sccm for 5 seconds, with a source power of 70 W and no bias power as with charge releasing steps 504 and 508.

The gas mixtures and amounts are selected based on the material and depth to be etched. Similarly the etching time and other parameters are selected in order to ensure sufficient etching occurs, Similarly, the power, Ar flow and time for each charge releasing step is selected to ensure that sufficient charge is released to prevent a premature halt of the etching process. In some embodiments, the power could be in the range from 70 to 300 W. The pressure could be in the range from 60 to 100 mTorr. It should be noted that other inert gases such as $N_2$ or He can, depending on the embodiment, be chosen instead of Ar.

Figure 11:
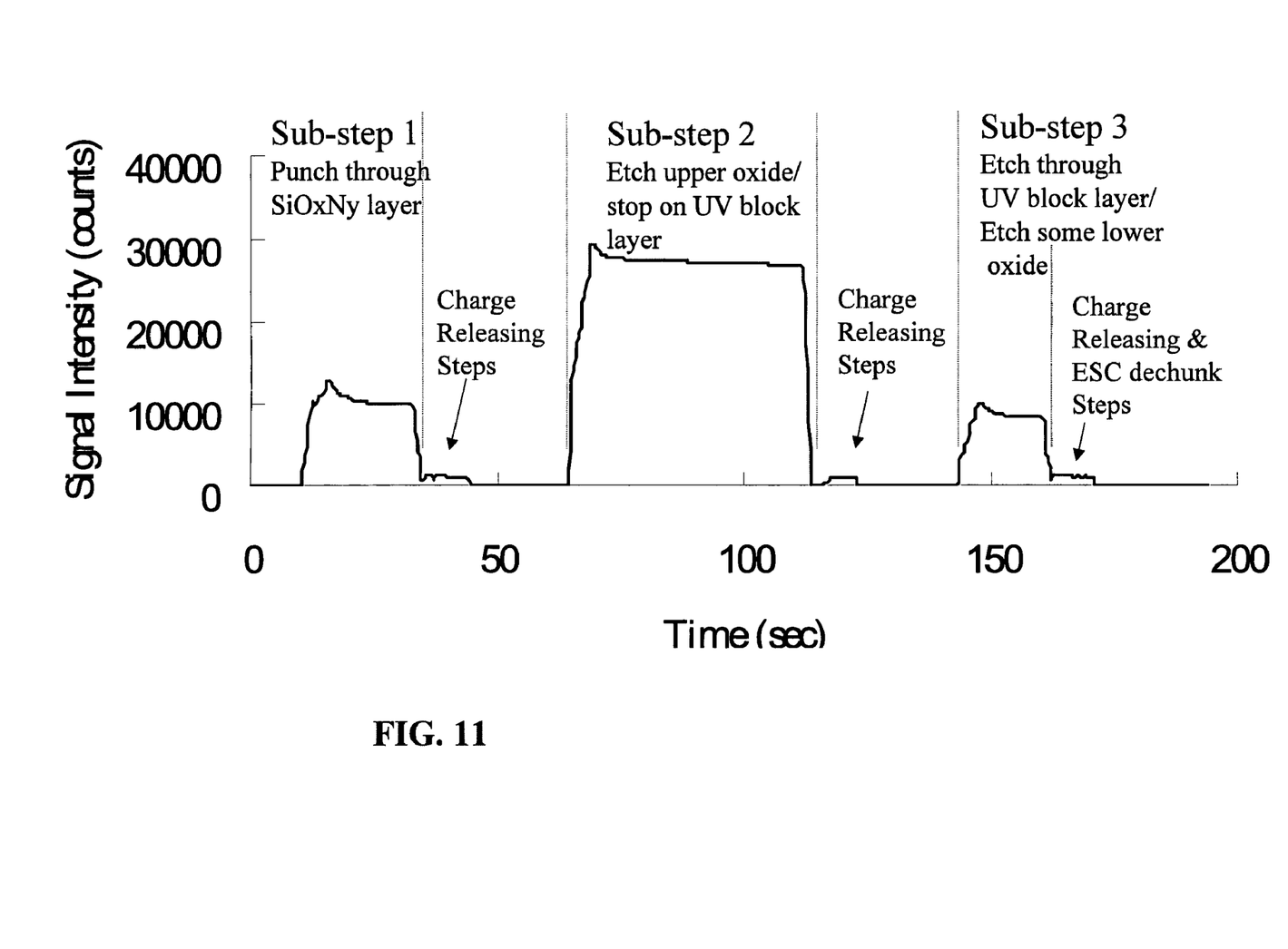
FIG. 11 is a diagram illustrating an example optical emissions profile produced during the process of FIG. 2.

FIG. 11 is a diagram illustrating an example output of an endpoint detector configured to monitor the optical emissions associated with the CO radicals during the etching process of FIG. 5. The waveforms associated with each of the steps in FIG. 11 indicate the amount of etching that is occurring on the single damascene structure. As can be seen, by including charge releasing steps 504, 508, and 512, a smoother transition into and out of each etching step can be achieved.

In certain embodiments, after a discharge step plasma is stabilized under a limited reflected power by holding a matching network in the reactor constant at its most recent condition, thus providing a smoother transition between the etching steps without extinguishing the plasma.

Figure 6:
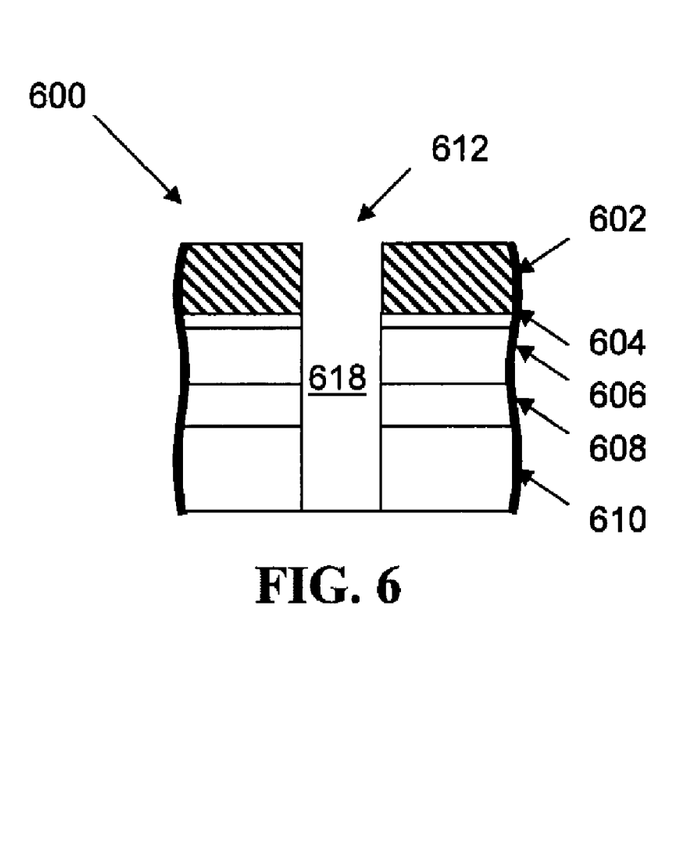
FIG. 6-9 is a diagram illustrating various steps in the formation of a trench structure in a dual damascene structure in accordance with one embodiment.

The processes described above can also be used to etch hole structures, such as via or contact holes. For example, FIG. 6 is a diagram illustrating an exemplary dual damascene structure 600 into which a via can be etched in accordance with one embodiment of the systems and methods described herein. Dual damascene structure 600 comprises 4 layers as illustrated. These layers include a lower dielectric layer 610, a UV block layer 608, an upper oxide layer 606 and a DARC layer 604. Depending on the embodiment, no photolithography is performed between layers 608, 606, and 604 and the composition of these layers may be such as to allow their growth by chemical vapor deposition (CVD) in a single plasma reacting chamber by varying the composition of the feed gases and the operating conditions between the layers.

As illustrated in FIG. 6, once dual damascene structure 600 comprising layers 604, 606, and 608, grown on substrate 610 is formed, a photo resist layer 602 can be deposited on top of layer 604. Layer 602 can then be photographically patterned to form a mask aperture 612, e.g., corresponding to a hole structure that is to be formed in single damascene structure 600.

In embodiments where mask aperture 612 defines a via hole, it can be assumed that layer 610 includes a metal surface in the area of the via hole. In certain embodiments, it is preferable that the metal comprise copper; however, other metals, such as TiN, Ti, aluminum, can also be used in accordance with the systems and methods described herein. It will be understood, that the composition of the metallization has very little effect upon the dielectric etch and thus, will not be discussed further herein unless it has a direct impact on the systems and methods being described.

Figure 10:
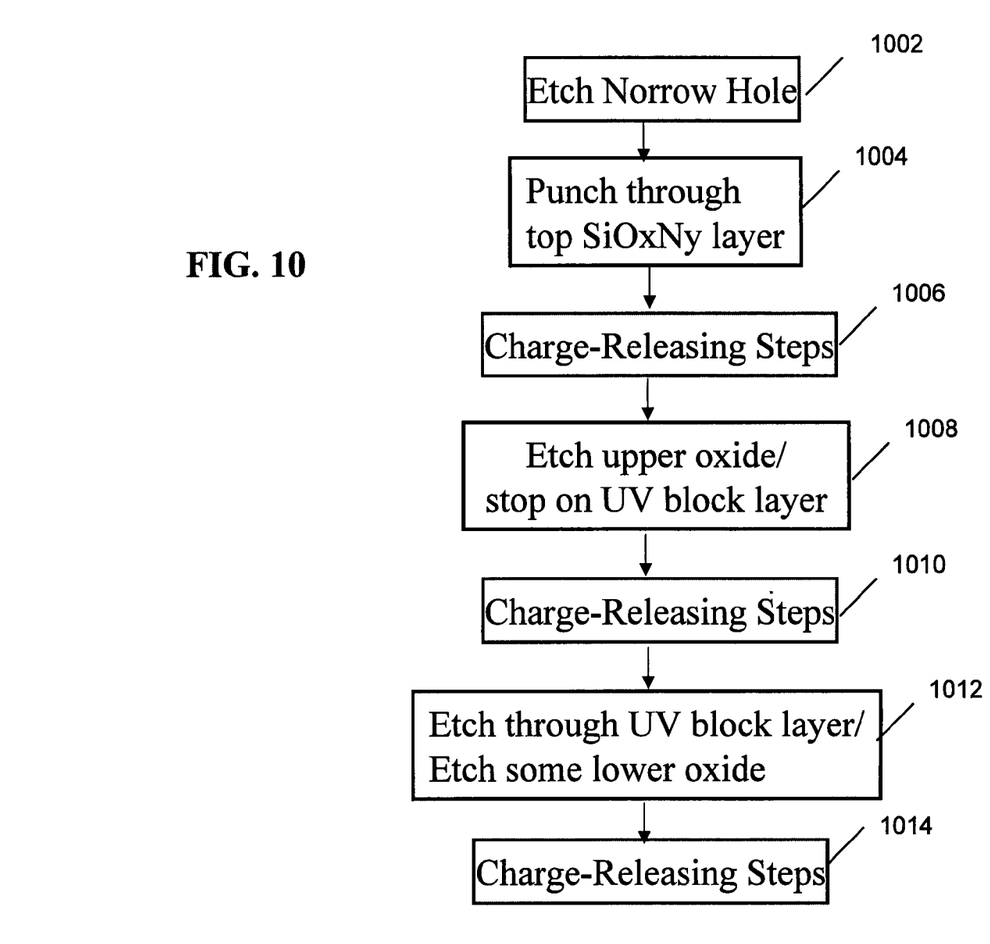
FIG. 10 is a flow chart illustrating a process for forming the trench in the structure of FIG. 6-9 in accordance with one embodiment.

FIG. 10 is a flowchart illustrating an example process for etching a via hole in a dual damascene structure 600 in accordance with one embodiment of the systems and methods described herein. The steps of FIG. 10, can be illustrated in conjunction with FIGS. 6-9. First, in step 1002, a relatively narrow hole 618 is etched through layers 604, 606, 608 and 610 as illustrated in FIG. 6. Photo resist layer 602 can then be stripped and a second photo resist layer 616 can then be deposited on layer 604. Layer 616 can then be photographically patterned to form a mask aperture 614, e.g., corresponding to a trench structure 620 that is to be formed in dual damascene structure 600 as illustrated in FIG. 7.

Figure 7:
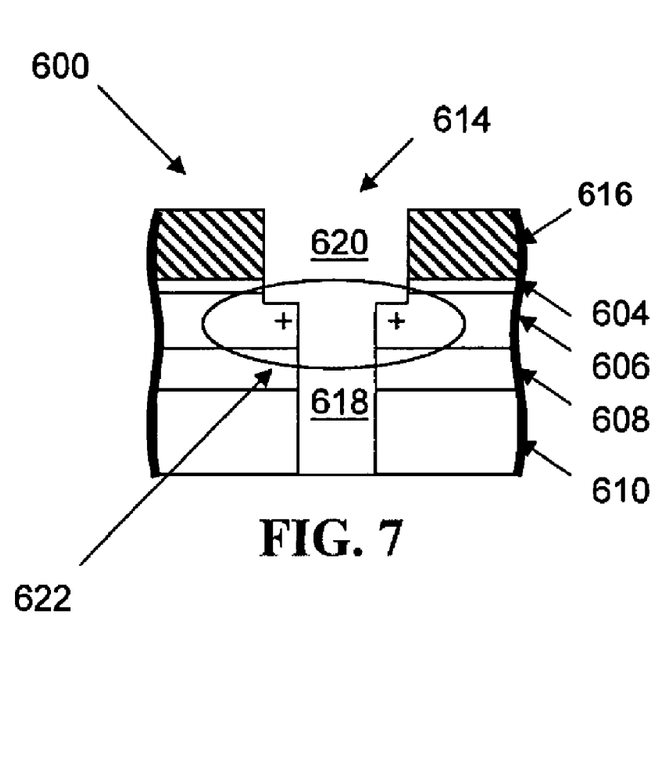

The beginning of trench 620 is formed by punching through top layer 604, in step 1004 as illustrated in FIG. 7. After first etching step 604, charge 622 will accumulate in dual damascene structure 600. As noted above, accumulated charge 622 can be great enough to cause the etching process to halt prematurely. Thus, in step 1006, a charge releasing step is performed in order to release some or all of accumulated charge 622. Enough of charge 622 should be released so as to prevent the premature halt of the etching process.

Figure 8:
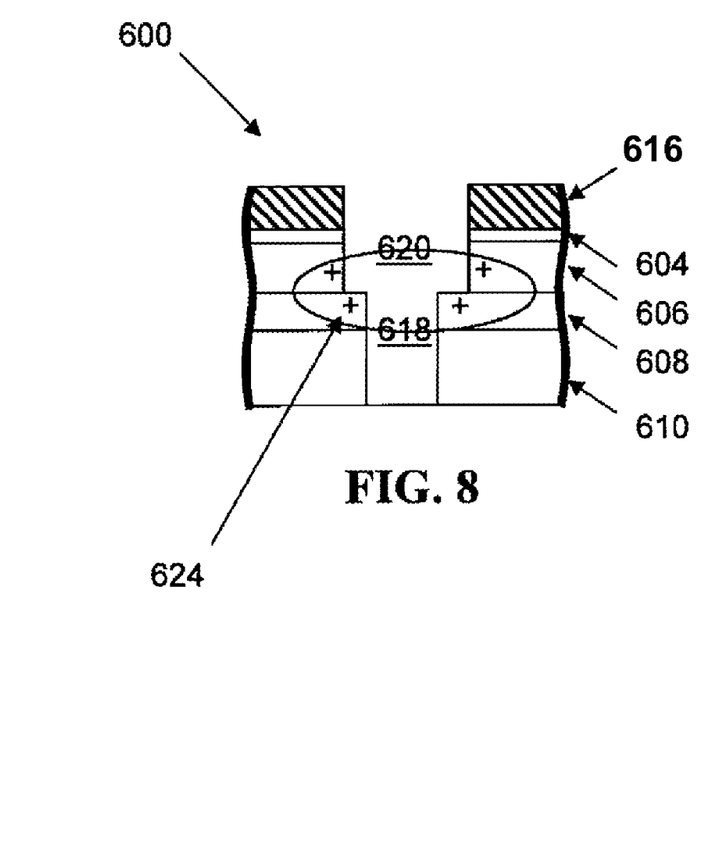
Figure 9:
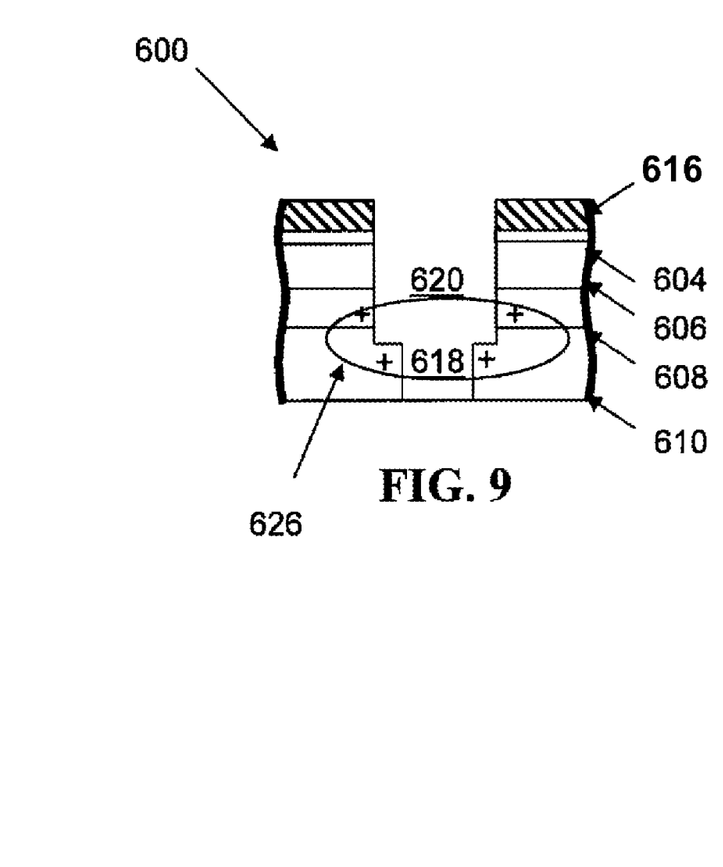

In step 1008, upper oxide layer 606 is etched in order to extend trench 620. Upper oxide layer 606 is etched down to UV block layer 608, which acts as a stop layer for the etching process of step 1008. Again, charge 624 will accumulate within dual damascene structure 600 as illustrated in FIG. 8. Thus, a second charge releasing step is performed in step 1010 in order to release some or all of accumulated charge 624. Again, enough of accumulated charge 624 should be released during step 1010 to prevent the premature halt of the etching process of step 1008.

UV block layer 608 is then etched through in step 1012 in order to extend trench 620 down to lower oxide layer 610. In certain embodiments, some portion of lower oxide layer 610 is etched during step 1012 of the process illustrated in FIG. 10. Again, charge 626 will accumulate after etching step 1012. Accumulated charge 626 can be released in charge releasing step 1014 in order to prevent the premature halt of the etching process of step 1012.

As with the single damascene process of FIGS. 1-5, the dual damascene process illustrated in FIGS. 6-10 can improve failure rates by producing a stable transition between etching steps.

All depositions for dual damascene structure 600 can be performed in the same plasma reaction chamber adapted for the supply of the different gases required and that includes hardware compatible with the different types of deposited material. The steps of FIG. 11 can also then be carried out by a plasma etch reactor, such as a dual frequency, capacitively coupled plasma reactor.

While certain embodiments of the inventions have been described above, it will be understood that the embodiments described are by way of example only. Accordingly, the inventions should not be limited based on the described embodiments. Rather, the scope of the inventions described herein should only be limited in light of the claims that follow when taken in conjunction with the above description and accompanying drawings.

What is claimed is:

1. A method for etching a multi-layered structure using a plasma reactor, comprising:

depositing a photoresist layer on top of the multi-layered dielectric structure;

flowing a first gas mixture into the plasma reactor and exciting the first gas mixture into a plasma capable of etching a first layer of the multi-layered dielectric structure;

etching the first layer using the plasma formed using the first gas mixture;

releasing an accumulated charge that results from the etching step performed on the first layer by applying a source power of constant magnitude to the plasma reactor before removing the photoresist layer;

flowing a second gas mixture into the plasma reactor and exciting the second gas mixture into a plasma capable of etching a second layer of the multi-layered dielectric structure; and etching the second layer using plasma formed using the second gas mixture.

2. The method of claim 1, further comprising photographically patterning the photoresist layer to form a mask aperture defining a structure to be etched in the multi-layered dielectric structure.

3. The method of claim 1, further comprising releasing an accumulated charge that results from the etching step performed on the second layer by applying the source power of constant magnitude to the plasma reactor.

4. The method of claim 1, further comprising:
flowing a third gas mixture into the plasma reactor and exciting the third gas mixture into a plasma capable of etching a third layer of the multilayer dielectric structure;
etching the third layer using the plasma formed using the third gas mixture; and
releasing an accumulated charge that results from the etching step performed on the third layer by applying the source power of constant magnitude to the plasma reactor.

5. The method of claim 1, wherein the step of etching the first layer uses a gas mixture comprising $Ar/CF_4/C_4F_8/O_2$.

6. The method of claim 1, wherein the step of releasing the charge accumulated during the step of etching the first layer uses an Ar gas.

7. The method of claim 1, wherein the step of releasing the charge accumulated during the step of etching the first layer uses a release time of 5 seconds.

8. The method of claim 1, wherein the step of releasing the charge accumulated during the step of etching the first layer uses a source power of 70 W and no bias power.

9. The method of claim 1, wherein the step on etching the second layer uses a gas mixture comprising $Ar/C_4F_8/CH_2/F_2/CO/O_2$.

10. The method of claim 1, wherein the step of etching the second layer uses for 20 seconds.

11. The method of claim 3, wherein the step of releasing the charge accumulated during the step of etching the second layer uses an Ar gas.

12. The method of claim 3, wherein the step of releasing the charge accumulated during the step of etching the second layer uses a release time of 5 seconds.

13. The method of claim 3, wherein the step of releasing the charge accumulated during the step of etching the second layer uses a source power of 70 W and no bias power.

14. The method of claim 4, wherein the step of etching the third layer uses a gas mixture comprising $Ar/CF_4/O_2$.

15. The method of claim 4, wherein the step of releasing the charge accumulated during the step of etching the third layer uses an Ar gas.

16. The method of claim 1, further comprising limiting reflected power by holding a matching network constant at its most recent condition after the step of releasing the charge accumulated during the step of etching the first layer.

17. A method for etching a multi-layered dielectric structure having a photoresist mask using a plasma reactor comprising;
flowing a gas mixture into the plasma reactor and exciting the gas mixture into a plasma capable of etching the layer;
etching the layer using the plasma formed using the gas mixture; and
releasing an accumulated charge that results from the etching step performed on the layer using an inert gas for a certain release time and at a source power of constant magnitude to the plasma reactor before removing the photoresist mask.

18. The method of claim 17, wherein the certain release time is 5 seconds.

19. The method of claim 17, wherein the source power is 70 W, and wherein the release step does not use a bias power.

20. A method of claim 17, wherein the inert gas comprises $N_2$, He or Ar.

* * * * *